United States Patent [19]

Kopp

[11] 4,056,414
[45] Nov. 1, 1977

[54] PROCESS FOR PRODUCING AN IMPROVED DIELECTRICALLY-ISOLATED SILICON CRYSTAL UTILIZING ADJACENT AREAS OF DIFFERENT INSULATORS

[75] Inventor: Robert J. Kopp, Los Altos, Calif.

[73] Assignee: Fairchild Camera and Instrument Corporation, Mountain View, Calif.

[21] Appl. No.: 737,749

[22] Filed: Nov. 1, 1976

[51] Int. Cl.² .................... H01L 21/20; H01L 21/76
[52] U.S. Cl. .................................. 148/175; 29/578; 29/580; 357/49; 357/50; 357/54
[58] Field of Search ............... 148/175; 29/578, 580; 357/49, 50, 54

[56] References Cited

U.S. PATENT DOCUMENTS

| | | | |
|---|---|---|---|
| 3,368,113 | 2/1968 | Shaunfield | 357/49 X |
| 3,381,182 | 4/1968 | Thornton | 357/50 X |
| 3,385,729 | 5/1968 | Larchian | 357/49 X |
| 3,423,255 | 1/1969 | Joyce | 148/175 |
| 3,738,883 | 6/1973 | Bean et al. | 357/49 X |
| 3,832,247 | 8/1974 | Saddler et al. | 148/175 |
| 3,913,121 | 10/1975 | Youmans et al. | 357/49 |
| 4,004,046 | 1/1977 | Price | 148/175 X |

*Primary Examiner*—L. Dewayne Rutledge
*Assistant Examiner*—W. G. Saba
*Attorney, Agent, or Firm*—Alan H. MacPherson; Henry K. Woodward; Norman E. Reitz

[57] ABSTRACT

Thermoprocessing of integrated-circuit devices and ionizing radiation environments create electronic charges in dielectric isolation materials and in dielectric-semiconductor interface regions. These charges can produce serious alterations in the operating characteristics of the devices and integrated circuits. The deleterious effect of these charges may be greatly reduced by the disclosed process which produces a single-crystal silicon film dielectrically isolated from a polycrystalline silicon support by an underlying insulator of either silicon nitride or silicon dioxide, both of which may be grown by the process at selected locations on the same chip.

9 Claims, 12 Drawing Figures

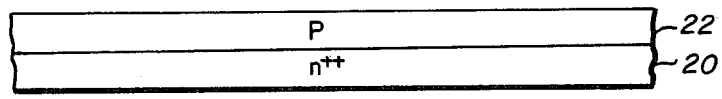
Fig_1
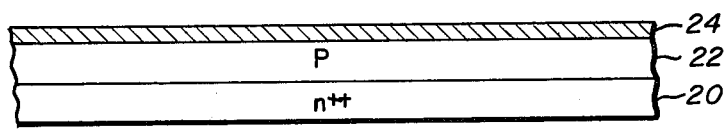
Fig_2
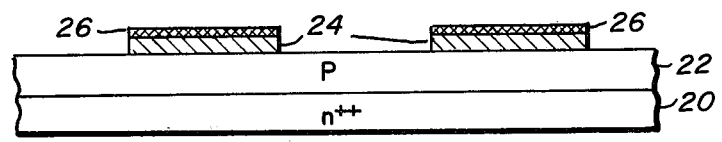
Fig_3
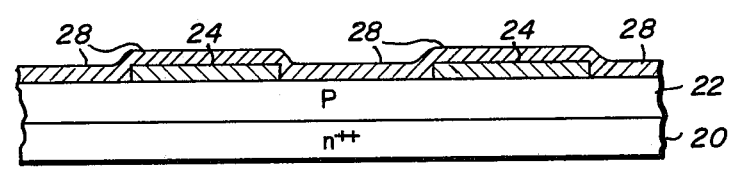
Fig_4
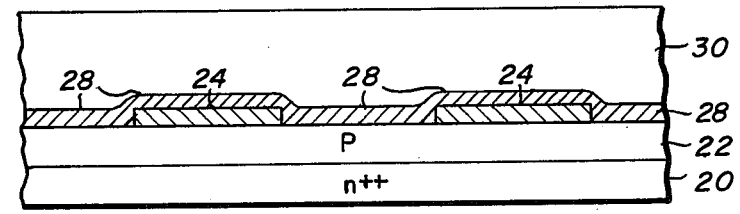
Fig_5
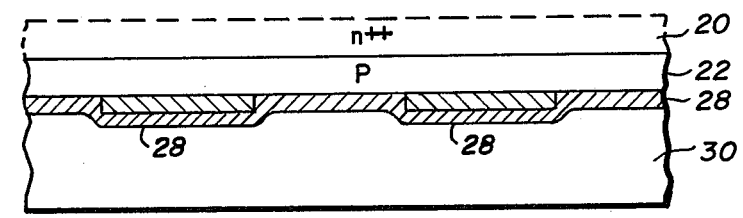
Fig_6

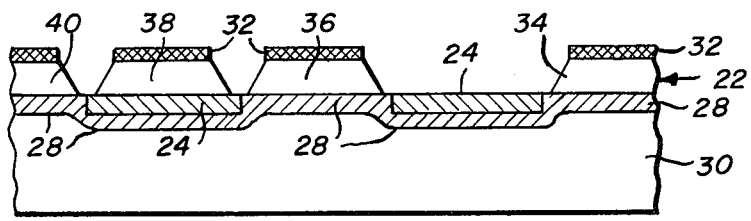
Fig_7
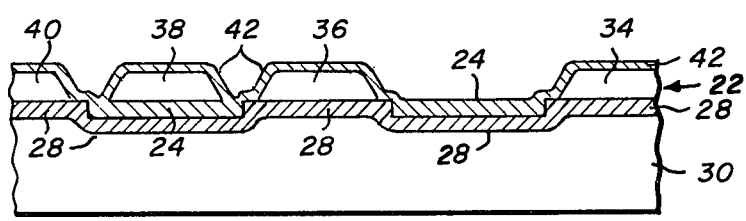
Fig_8
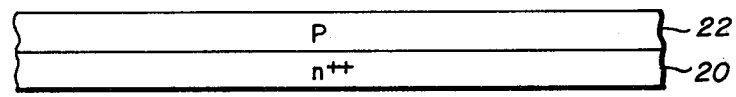
Fig_9
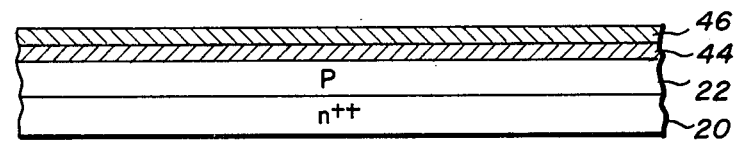
Fig_10
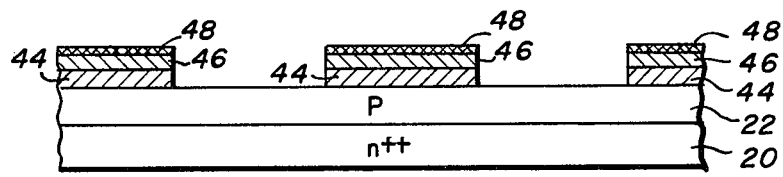
Fig_11
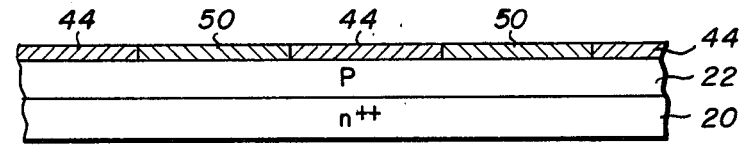
Fig_12

PROCESS FOR PRODUCING AN IMPROVED DIELECTRICALLY-ISOLATED SILICON CRYSTAL UTILIZING ADJACENT AREAS OF DIFFERENT INSULATORS

BRIEF SUMMARY OF THE INVENTION

During the manufacturing process of bipolar integrated circuits, the many semiconductor elements are generally isolated from each other by a process known as "junction isolation" in which a pocket of heavily-doped subepitaxial material is buried between the epitaxial layer and the common substrate material to form a current-blocking reverse-biased junction. The isolation is completed with "sidewall" junctions which intercept the lower junction. While junction isolation is both economical and effective under normal applications, there are conditions under which its inherent leakage currents and/or junction capacitances make it unacceptable, and in environments subject to intense ionizing radiation that may penetrate the casing of the integrated-circuit package, photocurrents may completely destroy isolation junctions. The radiation tolerance of MOS integrated circuits is also limited by primary and secondary photocurrents (a dose-rate effect) and, in addition, by the total-dose effect of electrical charge accumulation in associated dielectric materials and in oxide-semiconductor interface regions. For these reasons integrated-circuit devices are often fabricated with the many semiconductor elements separated from each other by a dielectric isolation in which a thin layer of dielectric material is formed between each single-crystal silicon pocket or island and a common polycrystalline silicon supporting layer. Most dielectric-isolation fabrication schemes also produce sidewall isolations which involve dielectric materials rather than p-n junctions. Such dielectric isolation offers significant advantages where speed, electrical isolation, and tolerance to ionizing radiation are important.

Formerly, the technological capacity for manufacturing dielectrically-isolated single-crystal silicon films on supporting layers has primarily included the so-called "single-poly", "double-poly", and "silicon-on-sapphire" processes. The first two processes lack the dimensional control necessary to define very thin silicon films and the incorporated sidewall isolations are relatively large thereby imposing an additional restriction on component density and speed. On the other hand, the silicon-on-sapphire process provides the precision dimensional control that is necessary and silicon films fabricated with this process can be made one micrometer or less in thickness with the uniformity of approximately 0.1 micrometers on a sapphire dielectric substrate. However, while the silicon-on-sapphire process was a considerable advance in the art, its use in the fabrication of many solid-state devices was limited by various properties of the sapphire material, such as its relatively low thermal conductivity, a mismatch in thermal properties at the silicon-sapphire interface, and poorly controlled process-induced and radiation-induced electrical charges within the structure. In addition, inherent limitations in the crystalline quality of the silicon film impose severe limitations on minority-carrier lifetime.

The disadvantages of the aforementioned single-poly, double-poly and silicon-on-sapphire processes are overcome by the present invention in which thin single-crystal epitaxial silicon films are formed on a polycrystalline silicon support layer and are separated therefrom by a thin dielectric isolation of either a thermally-deposited layer of silicon dioxide or a layer of silicon nitride, both of which may be selectively defined on the same chip during the disclosed process.

BRIEF DESCRIPTION OF THE DRAWINGS

In the drawings which illustrate a preferred embodiment of the invention:

FIG. 1 through FIG. 8 illustrate the various steps in the process of the fabrication of thin single-crystal silicon films dielectrically isolated by silicon dioxide and silicon nitride from a thick polycrystalline silicon substrate; and FIG. 9 through FIG. 12 illustrate an alternate process which may replace the steps illustrated in FIG. 1 through FIG. 4.

DETAILED DESCRIPTION

In the following description, it is assumed that it is desired to fabricate a generalized integrated circuit including either bipolar and MOS circuit elements or "complementary" (both n- and p-channel) MOS circuit elements. In such applications, which might include ionizing-radiation exposure, the bipolar-element properties are improved or preserved by the dielectric isolation and excellent minority-carrier lifetime, while the MOS-element properties are improved (or preserved) by the dielectric isolation and the selection of supporting dielectric material. For example, it can prove most beneficial to fabricate n-channel devices in silicon nitride supported islands and p-channel devices in silicon dioxide supported islands. The benefit is achieved by selectively controlling "back-bias" and "back-channel" effects through different electrical charges (process-induced and/or radiation-induced) under differently supported devices.

The description of the preferred embodiment will cover the development of a dielectrically-isolated p-type silicon film although it is to be understood that the process is equally applicable for fabricating lightly doped n-type films. As illustrated in FIG. 1, the formation of p-type silicon films is started with a highly-doped n-type single-crystal silicon wafer 20 which, in the illustrated embodiment, has a <100> crystal orientation. After wafer 20 is cleaned, it is mounted in an epitaxial reactor and about three micrometers of silicon are removed by hydrochloric-acid vapor etching. A p-type epitaxial silicon film 22 is then grown to a thickness of approximately four micrometers on the wafer 20 by the thermal decomposition of silane at approximately 1,000° C in order to obtain an abrupt doping concentration at the $n \pm p$ interface. As will be subsequently explained, the wafer 20 will eventually be removed by electrochemical etching and the sharp interface between wafer 20 and film 22 will result in a very thin p-type silicon film 22 of a uniform thickness that cannot be achieved by normal lapping and polishing methods of wafer thinning.

Upon the completion of the epitaxial growth of the p-type silicon film 22, a silicon dioxide film 24 is applied which has a thickness of between approximately 0.1 to 0.3 micrometers, preferably by thermal oxidation at approximately 1,000° C in an oxygen atmosphere.

As shown in FIG. 3, portions of the silicon dioxide film 24 that are to remain as dielectric isolation on the p-type silicon layer 22 are covered with a photoresist mask 26 and the remaining or exposed portions of the silicon dioxide are selectively removed to the surface of the film 22. The photoresist mask 26 is then removed and the entire surface is deposited with a film of silicon nitride 28 to a thickness approximating the thickness of the original silicon dioxide film 24 to produce the structure shown in FIG. 4.

The deposition of a thick layer of polycrystalline silicon on the insulator film then follows. Since this layer serves as a mechanical support for the thin film of single-crystal silicon, it should have adequate mechanical strength; therefore, as shown in FIG. 5, a polycrystalline silicon layer 30 having a thickness of approximately 250 micrometers is deposited at a relatively low temperature using dichlorosilane gas.

The original heavily-doped n-type silicon substrate wafer 20 is then removed by electrochemical etching. The entire wafer is inserted into an electrochemical etching bath which contains an electrolyte of five to seven percent hydrofluoric acid in deionized water which, under the conditions in the bath, readily attacks only the heavily-doped n-type silicon, and the wafer 20 is removed to the surface of the p-type film 22 as illustrated in FIG. 6.

The flat uniform silicon layer 22 is then hydrochloric-acid vapor thinned to the desired thickness. The wafer is then covered with a suitable masking material 32 and the p-type silicon is then anisotropically etched with a conventional material, such as potassium hydroxide to produce individual single-crystal silicon device islands 34, 36, 38 and 40, as illustrated in FIG. 7. (If the crystal wafer 20 and silicon film 22 were described in the preferred embodiment as having <111> crystal orientation, the sidewall isolation could be accomplished with local-oxidation techniques which require partial etching of the silicon film 22 in the sidewall regions for films exceeding approximately one micrometer in thickness.) Finally, a passivation layer 42 of silicon dioxide is applied by oxidizing the entire surface of the chip, as illustrated in FIG. 8. The chip now contains p-type epitaxial silicon semiconductor device islands separated from the polycrystalline silicon substrate 30 by a dielectric isolation of either a silicon dioxide layer 24 or silicon nitride layer 28. Selected islands may then be converted to n-type (or p-type if layer 22 were initially n-type) by ion-implantation or diffusion techniques, and the islands may then be processed into the desired circuit elements by conventional processes that form no part of the invention.

An alternate process which may replace the steps illustrated in FIG. 1 through FIG. 4 is illustrated in FIGS. 9 through 12. FIG. 9, which is identical to FIG. 1, illustrates a heavily-doped n-type single-crystal silicon substrate 20 supporting a p-type epitaxial silicon film 22. As illustrated in FIG. 10, the film 22 has been coated with a thin silicon nitride film 44. The silicon nitride film is then covered with a silicon dioxide film 46 and a photoresist mask 48 is used to selectively remove the silicon dioxide film 46, the remainder of which serves as a mask to define the silicon nitride film 44. As illustrated in FIG. 11, the silicon nitride film 44 is etched to the epitaxial film 22; this may be accomplished, for example, by hot phosphoric acid which readily attacks silicon nitride but which does not attack silicon dioxide. Upon completion of the etching of the silicon nitride, the chip is cleaned of all photoresist and silicon dioxide and is returned to a furnace for oxidation of the exposed areas of the silicon layer 22, as illustrated in FIG. 12; note that the oxidation which produces the silicon dioxide film 50 can have only a minor effect on the adjacent silicon nitride film 44. It will also be noted that FIG. 12 is essentially identical to FIG. 4 and, upon completion of the layer illustrated in FIG. 12, the process may be continued in accordance with the steps illustrated in FIGS. 5 through 8.

What is claimed is:

1. A method for fabricating single-crystal silicon films dielectrically isolated from each other and from a common substrate by silicon dioxide and silicon nitride insulating films, said method comprising the steps of:

epitaxially growing a silicon film to a thickness of approximately four micrometers on the surface of a heavily-doped n-type single-crystal silicon wafer;

coating the surface of said silicon film with a first dielectric material to a thickness of approximately 0.2 micrometers;

masking all portions of the surface of said first dielectric material that are to be retained for dielectric isolation and removing all portions of said first dielectric material that are not masked and are to be isolated by a second dielectric material;

coating the areas on the surface of said silicon film that have been exposed by the removal of portions of said first dielectric material with a second dielectric material;

depositing on the exposed surfaces of said first and second dielectric materials a relatively thick supporting layer of polycrystalline silicon;

removing said heavily-doped n-type silicon wafer by electrochemically etching it from said epitaxially-grown silicon film;

vapor thinning said silicon film to a desired thickness; and selectively etching through said silicon film to form individual single-crystal device islands on said first and second dielectric materials.

2. The method claimed in claim 1 wherein said epitaxially-grown silicon film is p-type silicon.

3. The method claimed in claim 1 wherein said epitaxially-grown silicon film is lightly-doped n-type silicon.

4. The method claimed in claim 1 wherein said first dielectric material is silicon dioxide and said second dielectric material is silicon nitride.

5. The method claimed in claim 4 further including the step of:

passivating said device islands with a silicon dioxide coating.

6. The method claimed in claim 1 wherein said first dielectric material is silicon nitride and said second dielectric material is silicon dioxide.

7. The method claimed in claim 6 wherein said step of coating the surface of said silicon film with silicon nitride is followed by the additional step of:

coating the surface of said silicon nitride with a layer of silicon dioxide to serve as a mask against silicon nitride etching.

8. The method claimed in claim 7 wherein unmasked portions of said silicon nitride are removed by hot phosphoric acid etch.

9. The method claimed in claim 8 further including the step of:

passivating said device islands with a silicon dioxide coating.

* * * * *